(12) United States Patent
Anderson

(10) Patent No.: US 7,018,269 B2
(45) Date of Patent: Mar. 28, 2006

(54) PAD CONDITIONER CONTROL USING FEEDBACK FROM A MEASURED POLISHING PAD ROUGHNESS LEVEL

(75) Inventor: Thomas W. Anderson, Livermore, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/465,731

(22) Filed: Jun. 18, 2003

(65) Prior Publication Data
US 2004/0259477 A1 Dec. 23, 2004

(51) Int. Cl.
B24B 49/00 (2006.01)

(52) U.S. Cl. .................. 451/5; 451/8; 451/41; 451/56; 451/444

(58) Field of Classification Search ............ 451/5, 451/6, 8, 11, 41, 56, 21, 443, 444, 285–289
See application file for complete search history.

(56) References Cited

U.S. PATENT DOCUMENTS

| | | | | |
|---|---|---|---|---|
| 5,961,373 A | * | 10/1999 | Lai et al. | 451/41 |
| 5,985,093 A | * | 11/1999 | Chen | 156/345.13 |
| 6,419,553 B1 | * | 7/2002 | Koinkar et al. | 451/21 |
| 2003/0136055 A1 | * | 7/2003 | Li et al. | 51/298 |
| 2004/0038534 A1 | * | 2/2004 | Taylor | 438/690 |
| 2004/0162006 A1 | * | 8/2004 | Hua et al. | 451/36 |

* cited by examiner

Primary Examiner—M. Rachuba
(74) Attorney, Agent, or Firm—Carr & Ferrell LLP

(57) ABSTRACT

The present invention is a system for controlling a pad conditioner in a CMP device. The system includes a roughness-sensing device mounted in proximity to a polishing pad. The roughness-sensing device generates an output responsive to a roughness of the polishing pad. A signal-processing unit then generates a roughness value of the polishing pad in response to the output from the roughness-sensing device, and generates a control signal in response to the generated roughness value. Finally, a control device controls motion of the pad conditioner in response to the control signal.

7 Claims, 3 Drawing Sheets

PAD CONDITIONER CONTROL USING FEEDBACK FROM A MEASURED POLISHING PAD ROUGHNESS LEVEL

BACKGROUND OF THE INVENTION

1. Field of the Invention

The present invention generally relates to conditioning polishing pads on chemical mechanical planarization systems (CMP, also referred to as chemical mechanical polishing systems). More particularly, the present invention relates to a closed-loop control system whereby an amount of pad conditioning is related to a measured roughness of the polishing pad.

2. Description of the Background Art

Semiconductor wafers are typically fabricated with multiple copies of a desired integrated circuit design that will later be separated and made into individual chips. A common technique for forming the circuitry on a semiconductor is photolithography. Part of the photolithography process requires that a special device (e.g., typically a photolithographic stepper or scanner) focus on the wafer to project an image of the circuit on the wafer. The ability of the device to focus on the surface of the wafer is often adversely affected by inconsistencies or unevenness on the surface of the wafer. This ability to focus becomes more critical as design rules become progressively smaller since the depth-of-focus becomes more limited as the resolution limit is decreased. Semiconductor wafers are also commonly constructed in layers, where a portion of a circuit is created on a first level and conductive vias are formed through deposited dielectric layers to connect with a next level of the circuit. Each layer of the circuit can create or add unevenness to the wafer. Typically, a wafer is planarized before generating the next circuit layer.

CMP techniques are used to planarize a bare wafer and many or all layers added thereafter. Available CMP systems often use a rotating wafer holder that brings the wafer into contact with a polishing pad moving in the plane of the wafer surface to be planarized. A polishing fluid, such as a chemical polishing agent or slurry containing microabrasives, is applied to the polishing pad to polish the wafer. The wafer holder rotates while the wafer is pressed against the rotating polishing pad to planarize the wafer.

During the planarization process, the properties of the polishing pad will change. Slurry particles and polishing byproducts accumulate on the surface of the pad. Polishing byproducts and morphology changes on the pad surface affect the properties of the polishing pad and cause the polishing pad to suffer from a reduction in both its polishing rate and performance uniformity. To maintain a consistent pad surface, provide microchannels for slurry transport, and remove debris or byproducts generated during the CMP process, polishing pads are typically conditioned. Pad conditioning restores the properties of the polishing pad by re-abrading or otherwise restoring the surface of the polishing pad. This conditioning process enables the pad to maintain a stable removal rate while polishing a substrate or planarizing a deposited layer and lessens the impact of pad degradation on the quality of the planarized wafer.

One method used for conditioning a polishing pad uses a rotary disk embedded with diamond particles to roughen the surface of the polishing pad. Typically, the disk is brought against the polishing pad and rotated about an axis perpendicular to the plane of the polishing pad while the polishing pad is rotated. The diamond-coated disks produce microgrooves on the surface of the polishing pad.

Currently, pad conditioners are simply applied to a polishing pad for a given time at a given force and rotational speed. However, the life of a polishing pad is a key factor in the cost of a CMP process. Overconditioning the polishing pad erodes the surface and reduces the life of the polishing pad as well as increases processing time. Conversely, underconditioning the polishing pad produces incomplete planarization often accompanied by reduced yields. Accordingly, advances in methods and apparatuses for conditioning polishing pads used in the chemical mechanical planarization of semiconductor wafers are necessary to improve polishing pad life, increase wafer throughput, and reduce costs.

SUMMARY OF INVENTION

The present invention is a system for controlling a pad conditioner in a CMP device. The system includes a roughness-sensing device configured to be mounted in proximity to a polishing pad. The roughness-sensing device is further configured to generate an output responsive to a roughness of the polishing pad. A signal-processing unit is configured to 1) generate a roughness value of the polishing pad in response to the output from the roughness-sensing device, and 2) generate a control signal in response to the generated roughness value. Finally, a control device is configured to control motion of the pad conditioner in response to the control signal.

The present invention is also a method for controlling a pad conditioner in a CMP device. The method includes sensing a roughness of a CMP polishing pad using a roughness-sensing device, determining a roughness value of the CMP polishing pad based on the sensed roughness, generating a control signal in response to the roughness value, and applying the control signal to a pad conditioner motion control device.

DESCRIPTION OF PREFERRED EMBODIMENTS

Figure 1:
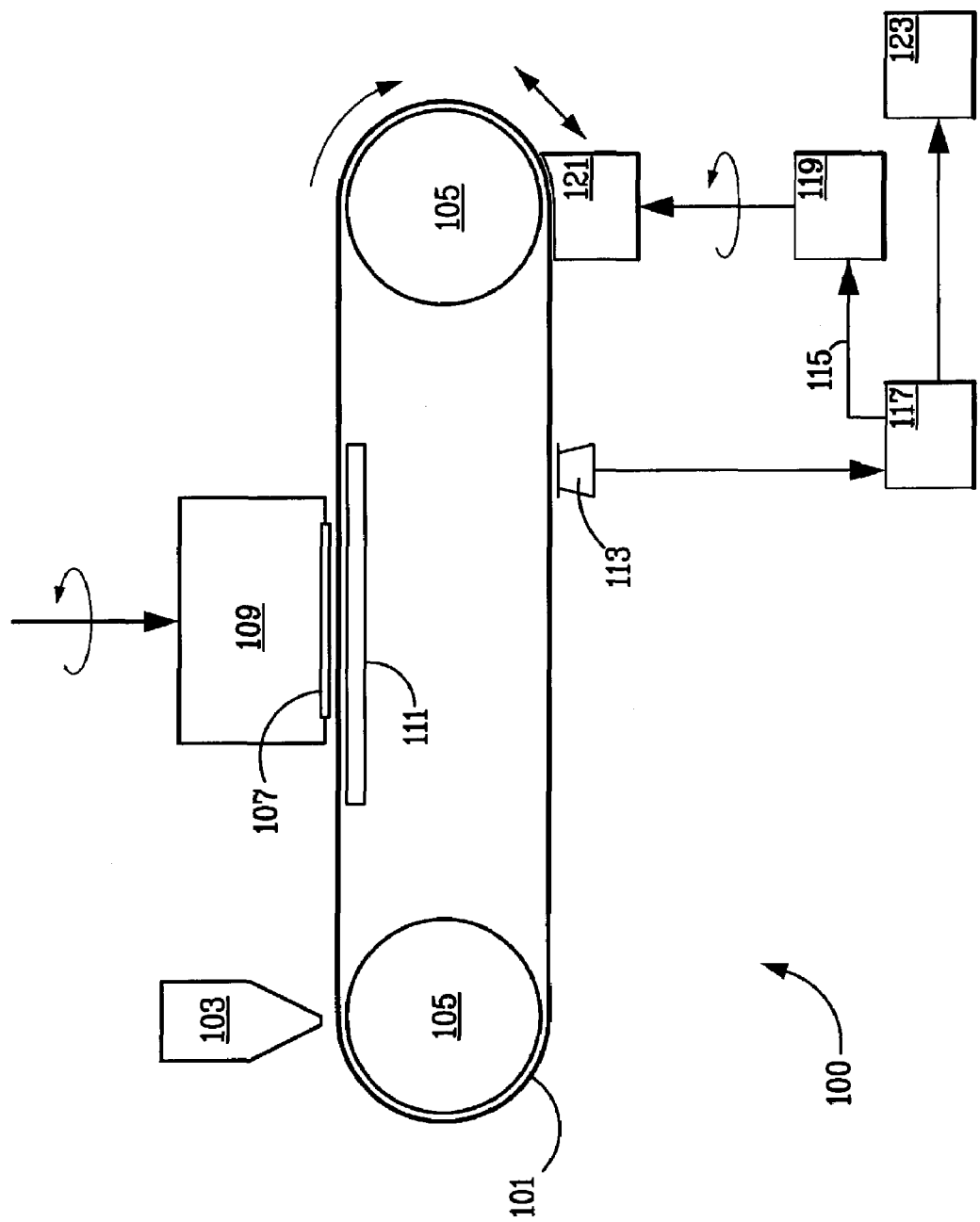
FIG. 1 is an exemplary overview diagram of an embodiment of the present invention for a closed-loop system for conditioning polishing pads on a linear CMP system.

FIG. 1 is an exemplary overview diagram of an embodiment of the present invention for a closed-loop system for conditioning polishing pads in a linear CMP system. The linear CMP system 100 typically includes a polishing pad 101, a slurry dispensing device 103, a plurality of drive rollers 105, a spindle downforce assembly (SDA) 109, a platen 111, a roughness-sensing device 113, a signal-processing unit 117, a control device 119, a pad conditioner 121, and an optional display device 123.

The SDA is designed to hold a semiconductor wafer 107 against the linearly rotating polishing pad 101. The SDA 109 typically exerts several hundred pounds of force on the wafer 107 against the polishing pad 101 while rotating at 10–200 revolutions per minute. The platen 111 is typically air-controlled to act as a backer counteracting the force applied by the SDA 109.

The roughness-sensing device 113, signal-processing unit 117, and control device 119 of the present invention are part of a closed-loop system to eliminate or reduce underconditioning or overconditioning of the polishing pad 101. The system also allows for non-uniform conditioning of the polishing pad 101. The roughness-sensing device 113 senses the topography or roughness of the polishing pad 101. The signal-processing unit 117 generates a roughness value from an output of the roughness-sensing device 113 and further generates a control signal 115 in response to the generated roughness value. The control device 119 controls a motion of the pad conditioner 121 in response to the control signal 115. Thus, the amount of conditioning of the polishing pad 101 is monitored and overconditioning or underconditioning is eliminated or reduced. Also, the polishing pad 101 may be non-uniformly conditioned when desired. Examples of non-uniform conditioning are described more fully below.

In one embodiment, the roughness-sensing device 113 is a mechanical stylus profilometer where the tip of the stylus is in contact with the linearly rotating polishing pad 101. The roughness-sensing device 113 is configured to traverse the polishing pad 101 transversely, for example, in a direction roughly perpendicular to a linear rotational direction of the polishing pad 101. One skilled in the art will recognize that the transverse movement may be accomplished by mechanisms such as a linear tracking device or a swept-arm design attached to the stylus. An output from the stylus profilometer embodiment of the roughness-sensing device 113 is coupled to the signal-processing unit 117. Details of the signal-processing unit 117 are described more fully below.

In another embodiment, the roughness-sensing device 113 is an optical profilometer. In this example, the roughness-sensing device 113 is located in proximity to the polishing pad 101. As with the stylus profilometer, the optical profilometer also traverses the polishing pad 101 transversely. An output from the optical profilometer embodiment of the roughness-sensing device 113 is coupled to the signal-processing unit 117.

In another embodiment, the roughness-sensing device 113 is a scatterometer. In this example, the roughness-sensing device 113 is located in proximity to the polishing pad 101. As with the stylus profilometer, the scatterometer also traverses the polishing pad 101 transversely. An output from the scatterometer embodiment of the roughness-sensing device 113 is coupled to the signal-processing unit 117.

The signal-processing unit 117 receives the output from the roughness-sensing device 113 and determines the roughness value of the polishing pad 101. The determination of roughness may occur in various ways through well-known analog and/or digital means.

In one embodiment, the signal-processing unit 117 is an accelerometer coupled to an output from a mechanical stylus roughness-sensing device 113. The accelerometer measures vibrational movement of the stylus and, consequently, provides a relative measure of roughness of the polishing pad 101.

In another embodiment, the signal-processing unit 117 converts an output signal from the roughness-sensing device 113 into a roughness value, typically in the form of a standard roughness metric. Standard roughness metrics include values of average roughness, $R_a$, and rms-roughness, $R_q$. Roughness metrics are determined by standard algorithms known in the art and frequently involve converting an analog input signal into a Fourier Transform (e.g., an FFT). Also, an FFT may be further converted into a power spatial density function (PSD) or an autocorrelation function.

Any of these roughness metrics may be displayed on the optional display 123. Optionally, one or more of these roughness metrics may be displayed on the optional display 123 as, for example, a function of belt transverse position and time.

The signal-processing unit 117 generates a control signal 115 in response to the roughness value. The roughness value indicates whether additional conditioning needs to be applied to the polishing pad 101 via pad conditioner 121 and which areas of the polishing pad 101 require conditioning. For example, a low value of roughness causes the signal-processing unit 117 to generate the control signal 115. The control signal 115, in turn, directs the control device 119 to apply a combination of pressure and rotational speed to the pad conditioner 121 for a given time period until the roughness level, as indicated by the roughness-sensing device 113, is within a prescribed range of roughness. The combination of applied pressure and rotational speed and the prescribed range of roughness are typically process dependent variables and will vary depending on deposited material, process step, device type, and so on.

The control device 119 imparts pressure and rotational motion to the pad conditioner 121. In one embodiment of the control device 119, pressure and rotational motion are pneumatically controlled. Alternatively, the control device 119 may be an electric motor coupled to linear actuators, hydraulically controlled motors coupled to a hydraulic ram, or other motion generation devices known in the art.

The pad conditioner 121 typically contains a diamond abrasive to condition the polishing pad 101. In one embodiment, the pad conditioner 121 traverses the polishing pad transversely via a linear track. In another embodiment, the pad conditioner 121 traverses the polishing pad 101 transversely via a swept-arm mechanism.

Figure 2:
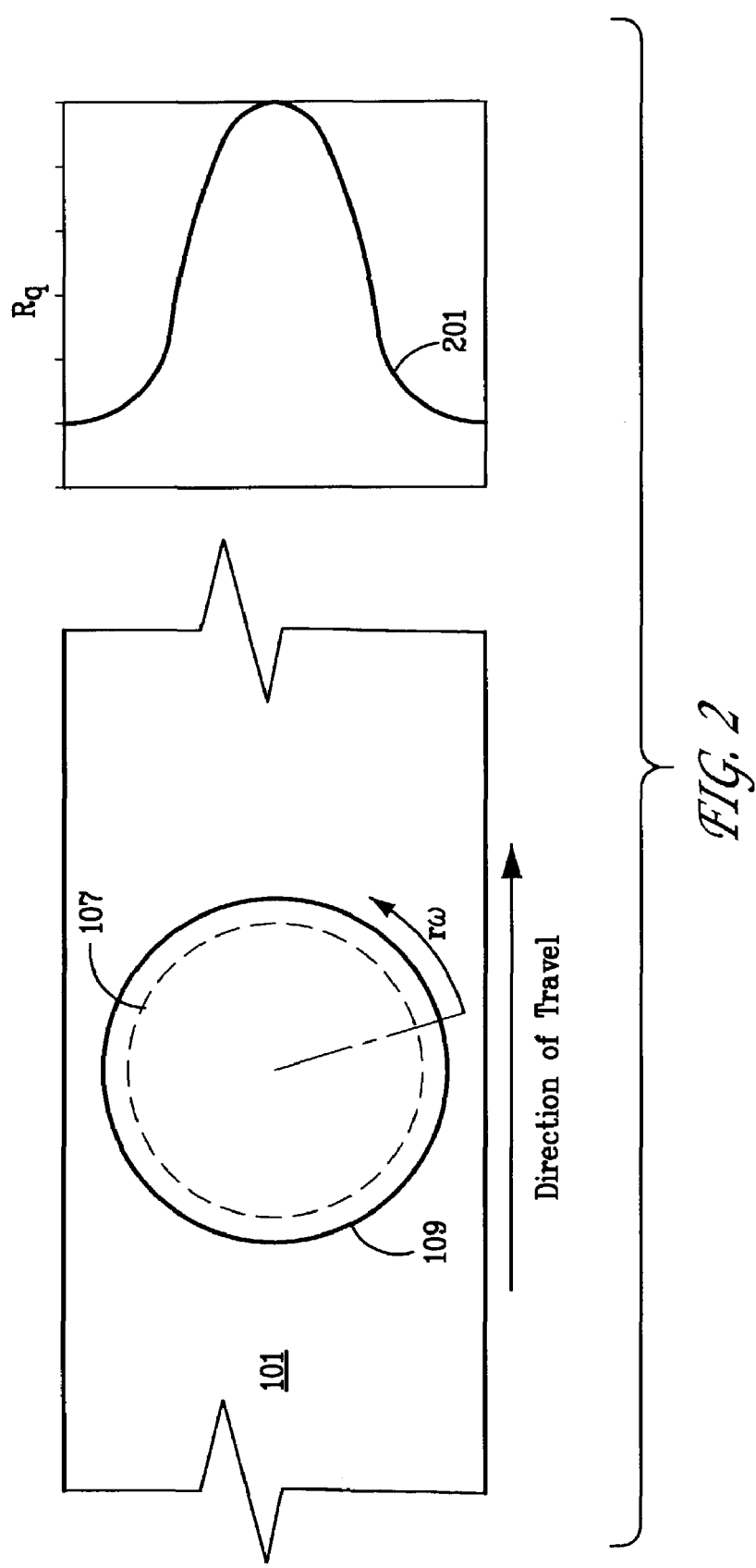
FIG. 2 is an exemplary embodiment of a roughness profile achieved on the polishing pad of the system of FIG. 1.

FIG. 2 is an exemplary embodiment of a roughness profile 201 achieved via conditioning of the polishing pad 101 of the system of FIG. 1. Since wafer 109 has a tangential velocity, $\overline{r\omega}$, if the polishing pad 101 is uniformly rough, the wafer 107 is planarized more quickly at an outer periphery of the wafer 107 than at the center of the wafer 107. However, by non-uniformly conditioning the polishing pad 101, various roughness profiles of the polishing pad 101 may be achieved. Consequently, by utilizing a non-uniformly rough polishing pad, planarization of the wafer 107 may be tailored to a specific process. For example, by conditioning the polishing pad 101 more heavily in the center than at the pad's edges, the roughness profile 201 as shown in FIG. 2 may be obtained. The roughness profile 201 more uniformly planarizes the wafer 107. Conditioning the polishing pad 101 more heavily in the center can be achieved by increasing pad conditioner downforce, rotational speed, or dwell time during conditioning of the center region than during conditioning of the edge regions. Other roughness profiles may be readily adopted for a specific process or process step.

Figure 3:
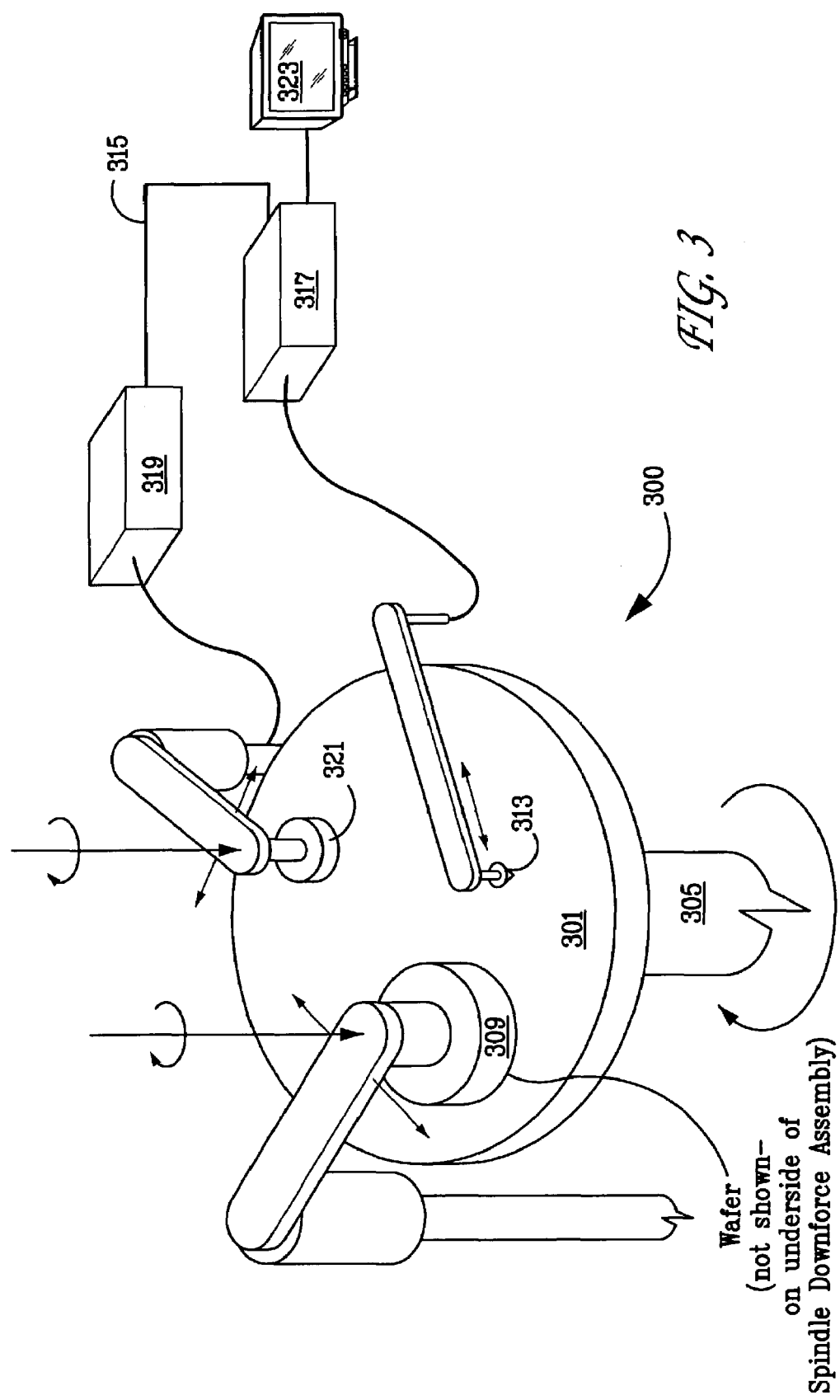
FIG. 3 is an exemplary overview diagram of an embodiment of the present invention for a closed-loop system for conditioning polishing pads on a rotary CMP system.

FIG. 3 is an exemplary overview diagram of an embodiment of the present invention for a closed-loop system for conditioning polishing pads on a rotary CMP system 300. The rotary CMP system 300 typically includes a polishing pad 301, a slurry dispensing device (not shown), a rotary drive stage 305, a spindle downforce assembly (SDA) 309, a roughness-sensing device 313, a signal-processing unit 317, a control device 319, a pad conditioner 321, and an optional display device 323. The roughness-sensing device 313, signal-processing unit 317, and control device 319 of the present invention perform essentially the same functions as the roughness-sensing device 113, the signal-processing unit 117, and the control device 119 of FIG. 1.

The functions of each of the various components of the rotary CMP system 300 are similar to the linear CMP system (FIG. 1). Various components may be configured in various ways known to one skilled in the art. For example, the SDA 309 and the pad conditioner 321 are shown utilizing a swept-arm design. Alternatively, a linear tracking design can be used to achieve similar results. Similarly, the linear tracking design of the roughness-sensing device 313 can be achieved utilizing a swept-arm design.

The present invention has been described above with reference to specific embodiments. It will be apparent to one skilled in the art that various modifications may be made and other embodiments can be used without departing from the broader scope of the present invention. For example, although the present invention has been exemplarily described in terms of a single roughness-sensing device 113, 313, one skilled in the art will recognize that a plurality of roughness-sensing devices could be used to alleviate or minimize the need for a transverse movement of the roughness-sensing device 113, 313. Additionally, the pad conditioner 121 of the linear CMP system 100 is shown located near one of the drive rollers 105. The pad conditioner 121 (as well as pad conditioner 321) may readily be mounted at other locations without diminishing the conditioning-efficiency. Further, although the system for controlling the pad conditioner 121, 321 has been described in terms of a closed-loop system, a skilled artisan will recognize that an open-loop system may be incorporated as well (for example, with a user governing a level of conditioning to the polishing pad 101, 301 based on a roughness metric being displayed on the optional display 123). These and other changes will still fall within the scope of the present invention.

What is claimed is:

1. A method for controlling a pad conditioner in a CMP device, comprising:
    sensing a roughness of a CMP polishing pad using a roughness-sensing device;
    determining a roughness value of the CMP polishing pad based on the sensed roughness;
    generating a control signal in response to the roughness value; and
    applying the control signal to a pad conditioner control device to non-uniformly condition the polishing pad to a roughness profile with a continuously varying shape.

2. The method of claim 1 further comprising repeating the steps of sensing a roughness, determining a roughness value, generating a control signal, and applying the control signal until the roughness value is within a prescribed range of roughness.

3. The method of claim 1 wherein the step of applying the control signal creates a non-linear roughness on the polishing pad by applying one or more conditioning variables, wherein the conditioning variables are selected from a group consisting of pad conditioner rotational rate, pad conditioner pressure, and pad conditioner time in contact with the polishing pad.

4. The method of claim 1 wherein the roughness value is displayed as an average roughness value.

5. The method of claim 1 wherein the roughness value is displayed as an rms roughness value.

6. The method of claim 1 wherein the roughness value is displayed as a result from a power spectral density function.

7. The method of claim 1 wherein the roughness value is displayed as a result from an autocorrelation function.

\* \* \* \* \*